United States Patent
Choi

(10) Patent No.: US 12,294,381 B2
(45) Date of Patent: May 6, 2025

(54) ANALOG TO DIGITAL CONVERTER AND OPERATION METHOD THEREOF

(71) Applicant: SK keyfoundry Inc., Cheongju-si (KR)

(72) Inventor: Hunbae Choi, Seoul (KR)

(73) Assignee: SK keyfoundry Inc., Cheongju-si (KR)

( * ) Notice: Subject to any disclaimer, the term of this patent is extended or adjusted under 35 U.S.C. 154(b) by 204 days.

(21) Appl. No.: 18/115,229

(22) Filed: Feb. 28, 2023

(65) Prior Publication Data

US 2024/0080036 A1 Mar. 7, 2024

(30) Foreign Application Priority Data

Aug. 23, 2022 (KR) .................. 10-2022-0105353

(51) Int. Cl.
*H03M 1/12* (2006.01)
*G11C 27/02* (2006.01)
*H03M 1/08* (2006.01)

(52) U.S. Cl.
CPC ............ *H03M 1/1245* (2013.01); *G11C 27/02* (2013.01); *H03M 1/08* (2013.01); *H03M 1/124* (2013.01)

(58) Field of Classification Search
CPC ...... H03M 1/1245; H03M 1/08; H03M 1/124; G11C 27/02
See application file for complete search history.

(56) References Cited

U.S. PATENT DOCUMENTS 10,720,911 B2 7/2020 Shin et al.
2017/0331488 A1* 11/2017 Lee ...................... G11C 27/024

FOREIGN PATENT DOCUMENTS

KR 10-2017-0127336 A 11/2017

OTHER PUBLICATIONS

Korean Office Action issued on Jan. 11, 2024, in counterpart Korean Patent Application No. 10-2022-0105353 (4 pages in Korean).

* cited by examiner

*Primary Examiner* — Joseph J Lauture
(74) *Attorney, Agent, or Firm* — NSIP Law

(57) ABSTRACT

The analog-to-digital converter (ADC) includes a sample and hold circuit configured to sample an analog input voltage and hold the sampled voltage. The sample and hold circuit includes: an analog switch configured to generate a boosting voltage obtained by adding a constant voltage to the analog input voltage, and output an analog output voltage corresponding to the analog input voltage by using the boosting voltage; and a capacitor in which the analog output voltage is charged.

15 Claims, 16 Drawing Sheets

ANALOG TO DIGITAL CONVERTER AND OPERATION METHOD THEREOF

CROSS-REFERENCE TO RELATED APPLICATIONS

The present application claims the benefit under 35 U.S.C. § 119(a) of Korean Patent Application No. 10-2022-0105353, filed on Aug. 23, 2022, in the Korean Intellectual Property Office, the entire disclosure of which is incorporated herein by reference for all purposes.

BACKGROUND

1. Field

The following description relates to an analog-to-digital converter and an operation method thereof.

2. Description of the Related Art

An analog-to-digital converter (ADC) converts an analog signal into a digital signal. The ADC is being used in various fields such as mobile devices, home appliances, automobile industries, etc. There are various types of ADCs. Recently, a successive approximation register (SAR) type ADC is most commonly used.

The SAR-type ADC is a converter that quantizes through binary search. The SAR-type ADC determines and outputs digital signal values from the most significant bit to the least significant bit continuously by using a digital-to-analog converter (DAC) and a comparator.

Also, the ADC may include a sample & hold (S&H) circuit in order to convert a continuous analog input voltage into a discontinuous waveform. The S&H circuit may include an analog switch and a capacitor. The S&H circuit may sample an analog input voltage using the analog switch and hold the sampled input voltage using the capacitor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In general, it is ideal that an analog switch has a resistance value of 0. However, analog switches actually have a certain resistance value. Therefore, when the analog input voltage reaches a certain value, the ON-resistance of the analog switch may increase infinitely. In this case, the input voltage may not pass to the output voltage due to the voltage drop across the switch.

In addition, in order to improve the accuracy of the SAR-type ADC, it is important that the output value of the DAC included in the SAR-type ADC is not affected by external influences such as noise. However, in a real situation, various noise components (such as power supply noise, ground noise, and noise caused by other external influences) may affect the output value of the DAC.

Therefore, various embodiments of the present disclosure disclose an analog-to-digital converter including a circuit for minimizing an ON-resistance of an analog switch and a method of operating the analog-to-digital converter.

In addition, various embodiments of the present disclosure disclose an analog-to-digital converter having high performance even in a noisy environment and an operation method thereof.

The technical problems to be overcome in this document are not limited to the technical problems mentioned above. Other technical problems not mentioned can be clearly understood by those skilled in the art from those described below.

In one general aspect, an analog-to-digital converter includes a sample and hold circuit configured to sample an analog input voltage and hold the sampled voltage. The sample and hold circuit may include: an analog switch configured to generate a boosting voltage obtained by adding a constant voltage to the analog input voltage, and output an analog output voltage corresponding to the analog input voltage by using the boosting voltage; and a first capacitor in which the analog output voltage is charged.

The analog switch may include: a bootstrap configured to generate the boosting voltage by adding the constant voltage to the analog input voltage according to a control signal, and output the boosting voltage; and a switch configured to be turned on and output the analog output voltage corresponding to the analog input voltage in response to the boosting voltage being input to a gate of the switch.

The switch may include a first NMOS transistor.

A gate-source voltage of the first NMOS transistor may become the constant voltage irrespective of the analog input voltage.

The bootstrap may include: a second capacitor in which the constant voltage is charged according to a clock signal for sampling; and a transmission gate configured to transfer the analog input voltage to the second capacitor based on a voltage sampling signal. The analog input voltage transferred from the transmission gate may be added to the constant voltage charged in the second capacitor and the boosting voltage may be output to an output terminal of the bootstrap.

The second capacitor may include at least one NMOS transistor.

The transmission gate may include an NMOS transistor and a PMOS transistor connected in parallel. The voltage sampling signal may be input to a gate of the NMOS transistor of the transmission gate, and a voltage sampling inversion signal may be input to a gate of the PMOS transistor. The voltage sampling inversion signal may be obtained by inverting the voltage sampling signal.

The bootstrap may further include: first and second resistance elements connected in series between a power supply voltage and a ground, and configured to divide the power supply voltage; and a second NMOS transistor configured to receive the divided power supply voltage. The second NMOS transistor may include a gate configured to receive the divided power supply voltage, a drain connected to a clock signal input terminal, and a source connected to the second capacitor.

The bootstrap may further include: a third NMOS transistor, both ends of the third NMOS transistor are connected to the second capacitor and the ground, and a gate of the third NMOS transistor is configured to receive a voltage holding signal.

The voltage sampling signal and the voltage holding signal may be non-overlapping.

In another general aspect, an analog switch may include: a bootstrap configured to generate a boosting voltage obtained by adding a constant voltage to an analog input voltage according to a control signal, and output the boosting voltage; and a switch configured to receive the boosting voltage through a gate which is turned on by the boosting voltage, and output an analog output voltage corresponding to the analog input voltage.

The switch may include a first NMOS transistor, and the switch may be connected to a first capacitor in which the analog output voltage is charged.

A gate-source voltage of the first NMOS transistor may become the constant voltage irrespective of the analog input voltage.

The bootstrap may include: a second capacitor in which the constant voltage is charged according to a clock signal for sampling; and a transmission gate configured to transfer the analog input voltage to the second capacitor according to a voltage sampling signal. The analog input voltage transferred from the transmission gate may be added to the constant voltage charged in the second capacitor, and the boosting voltage may be output to an output terminal of the bootstrap.

The second capacitor may include at least one NMOS transistor.

The transmission gate may include an NMOS transistor and a PMOS transistor connected in parallel. The voltage sampling signal may be input to a gate of the NMOS transistor of the transmission gate, and a voltage sampling inversion signal may be input to a gate of the PMOS transistor. The voltage sampling inversion signal may be obtained by inverting the voltage sampling signal.

The bootstrap may further include: first and second resistance elements connected in series between a power supply voltage and a ground, and configured to divide the power supply voltage; and a second NMOS transistor configured to receive the divided power supply voltage. The second NMOS transistor may include a gate configured to receive the divided power supply voltage, a drain connected to a clock signal input terminal, and a source connected to the second capacitor.

The bootstrap may further include a third NMOS transistor. Both ends of the third NMOS transistor may be connected to the second capacitor and the ground, and a gate of the third NMOS transistor may be configured to receive a voltage holding signal. The voltage sampling signal and the voltage holding signal may be non-overlapping.

In another general aspect, an operation method of an analog-to-digital converter may include: generating a boosting voltage by adding a constant voltage to an analog input voltage in an analog switch; outputting an analog output voltage corresponding to the analog input voltage by using the boosting voltage in the analog switch; charging the analog output voltage in a first capacitor; and converting the analog output voltage into a digital signal.

The generating of the boosting voltage may include: charging the constant voltage in a second capacitor by using a clock signal in the analog switch; and adding the constant voltage charged in the second capacitor to the analog input voltage and outputting the added result, by using a voltage sampling signal. Other features and aspects will be apparent from the following detailed description, the drawings and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
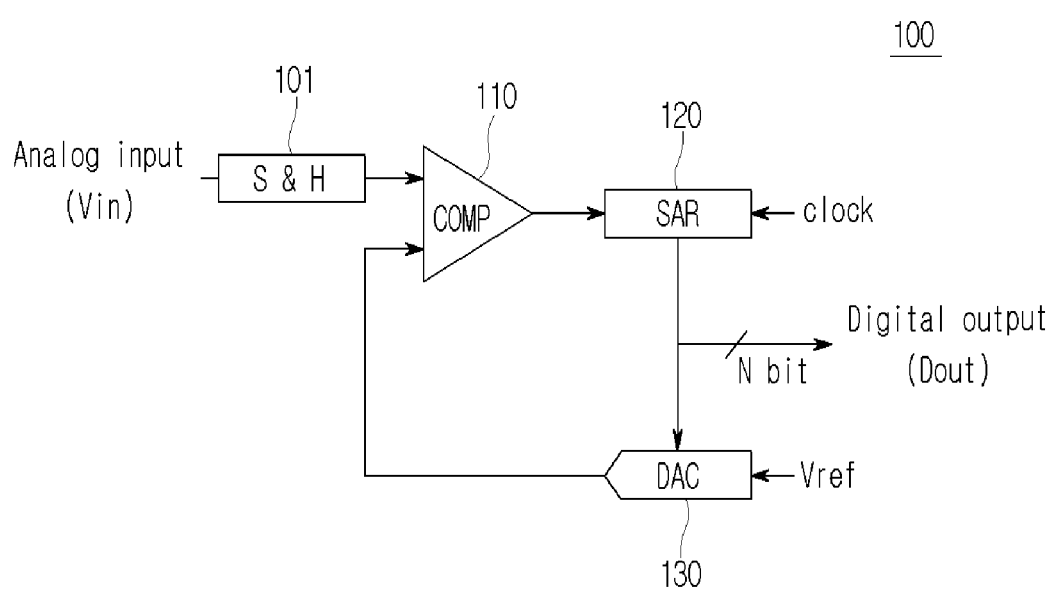
FIG. 1 illustrates a structure of a successive approximation register (SAR) type analog-to-digital converter (ADC)

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present invention may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the record medium may be resident within an application specific integrated circuit (ASIC). The ASIC may be resident within a user's terminal.

Hereinafter, for convenience of description, a successive approximation register (SAR) type analog-to-digital converter (ADC) will be taken as an example in this disclosure. However, some of the embodiments described below are not limited to the SAR-type ADC. For example, the embodiments of FIGS. 2 to 10 described below can be applied to all types of ADCs including a Sample and Hold (S&H) circuit. Also, hereinafter, although the SAR-type ADC will be described as an example, analog switches described in FIGS. 2 to 10 are not limited to the SAR-type ADC. For example, the analog switches described in FIGS. 2 to 10 may be applied to other types of ADCs in the same manner.

FIG. 1 illustrates a structure of a SAR-type ADC 100. Referring to FIG. 1, the SAR-type ADC 100 may include a sample and hold (S&H) circuit 101, a comparator 110, a successive approximation register (SAR) 120, and a digital-to-analog converter (DAC) 130.

The sample and hold circuit 101 may be provided in the front of the ADC 100 and may sample an analog input voltage Vin in accordance with an input control signal and may hold the sampled voltage. The sample and hold circuit 101 may provide the sampled voltage to a first input terminal of the comparator 110 according to the control signal.

The comparator 110 may compare a first analog input voltage Vin1 input through the first input terminal and a voltage Vdac input through a second input terminal, and may output a high or low digital signal Vout according to the comparison result. Here, the first analog input voltage Vin1 input through the first input terminal may be an analog output voltage Vout output from the sample and hold circuit 101. The voltage Vdac input through the second input terminal may be an analog voltage output from the DAC 130. For example, when the first analog input voltage Vin1 is greater than the output voltage Vdac of the DAC 130, the comparator 110 outputs a high signal, and the first analog input voltage Vin1 is less than the output voltage Vdac of the DAC 130, the comparator 110 outputs a low signal.

The SAR 120 may continuously store a digital signal value from the most significant bit (MSB) to the least significant bit (LSB) on the basis of the digital signal which is output from the comparator 110 according to a clock signal, and may output the stored value as a digital output data Dout.

The DAC 130 may convert the digital signal value stored in the SAR 120 into an analog signal according to a reference voltage Vref and may output it. For example, the DAC 130 may output an analog signal corresponding to the digital signal value on the basis of a reference voltage ladder (not shown). The analog signal output from the DAC 130 may be provided to the second input terminal of the comparator 110.

Figure 2:
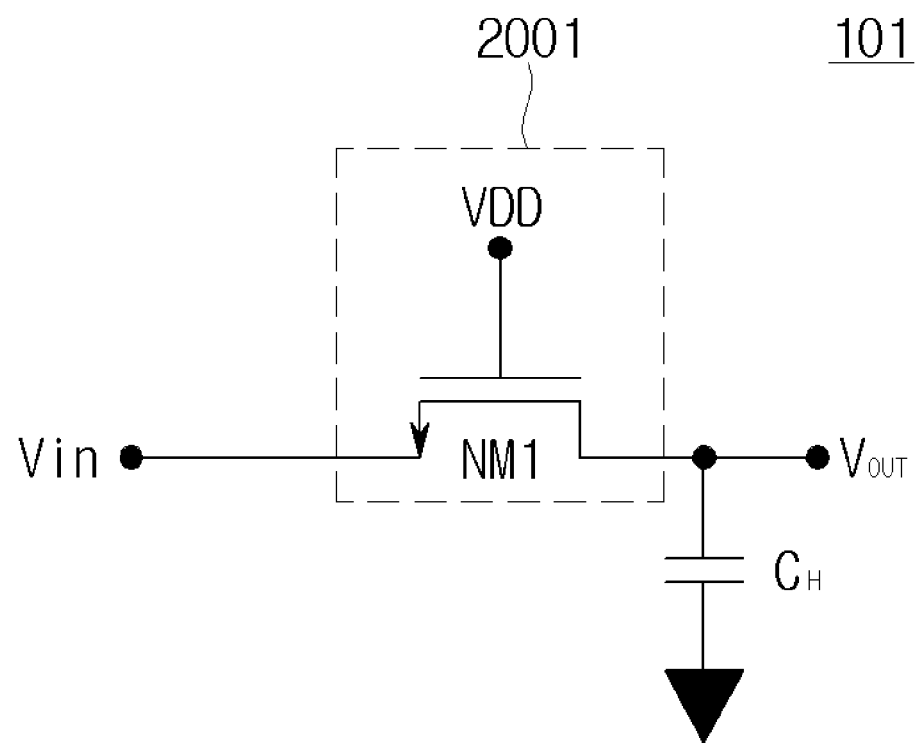
FIG. 2 illustrates a structure of a sample & hold (S&H) circuit including an analog switch.
Figure 3A:
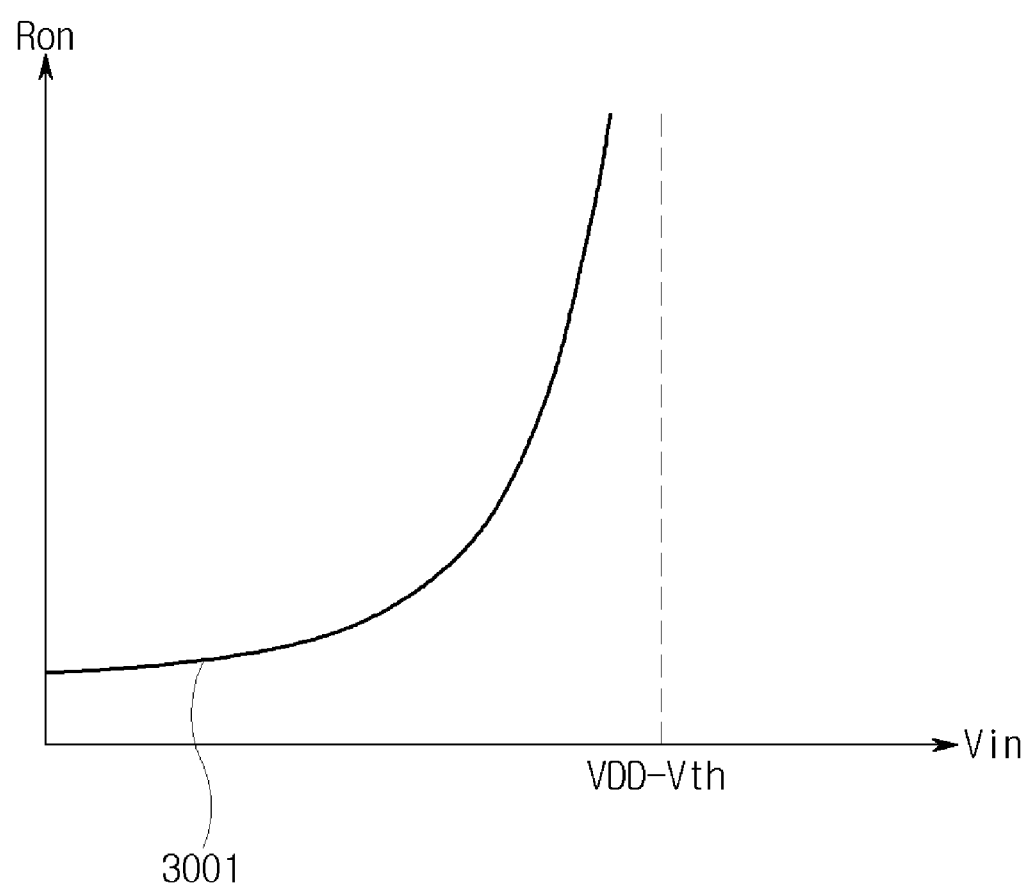
FIG. 3A illustrates a graph showing a relationship between an ON-resistance and an analog input voltage of the analog switch.
Figure 3B:
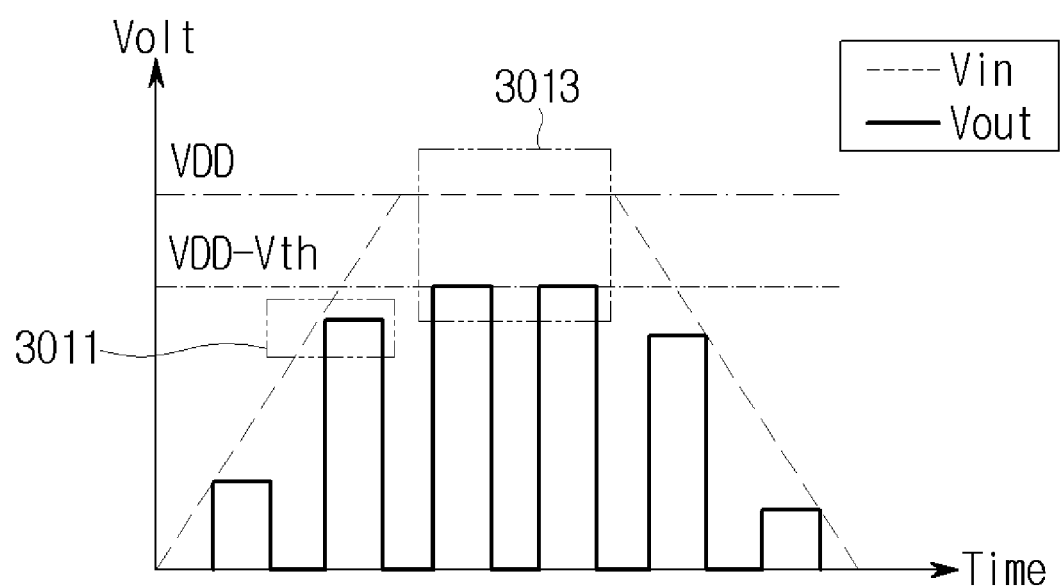
FIG. 3B illustrates a graph showing a relationship between an analog input voltage and an analog output voltage of the analog switch.

FIG. 2 illustrates a structure of the sample & hold circuit 101 including an analog switch 2001. In the following embodiment, the operation of some of the components of FIG. 2 may be described with reference to FIGS. 3A and 3B. FIG. 3A illustrates a graph showing a relationship between an ON-resistance and an analog input voltage Vin of the analog switch 2001. FIG. 3B illustrates a graph showing a relationship between the analog input voltage Vin and the analog output voltage Vout of the analog switch 2001.

As shown in FIG. 2, the sample and hold (S&H) circuit 101 may include an analog switch 2001 and a capacitor CH. In an example, the analog switch 2001 may be an NMOS transistor. For example, the analog switch 2001 may be composed of a first NMOS transistor NM1. In one or more embodiments of the present disclosure, for convenience of description, a case where the analog switch 2001 is composed of the NMOS transistor will be described as an example. However, one or more embodiments of the present disclosure are not limited thereto and may be applied in the same manner to even a case where the analog switch 2001 is composed of components (e.g., a PMOS transistor or a transmission gate) other than the NMOS transistor.

The first NMOS transistor NM1 may be on/off controlled based on a power supply voltage VDD input to a gate terminal thereof. When the first NMOS transistor NM1 is turned on by the power supply voltage VDD input to the gate terminal, the first NMOS transistor NM1 may perform a sampling operation of outputting the analog output voltage Vout corresponding to the analog input voltage Vin.

The capacitor CH may perform a hold operation by charging the analog output voltage Vout output from the first NMOS transistor NM1.

When the ON-resistance (Ron) between a drain and a source is zero, the first NMOS transistor NM1 constituting the analog switch 2001 described above may ideally operate. However, in an actual environment, the first NMOS transistor NM1 has an ON-resistance according to the analog input voltage Vin. For example, as shown in FIG. 3, as the analog input voltage Vin approaches a specified voltage value, the ON-resistance 3001 between the drain and the source of the first NMOS transistor NM1 diverges infinitely, so that the switch may be turned off. Here, the specified voltage value may be a value obtained by subtracting a threshold voltage Vth from the power supply voltage VDD.

Accordingly, when the analog input voltage Vin is equal to or greater than the specified voltage value, the first NMOS transistor NM1 cannot operate normally. For example, as shown in FIG. 3B, when the analog input voltage Vin is less than the specified voltage value (3011), the first NMOS transistor NM1 may output an analog output voltage Vout corresponding to the analog input voltage Vin during a sampling period according to the clock signal. However, when the analog input voltage Vin is greater than the specified voltage value (3013), the first NMOS transistor NM1 may output an analog output voltage Vout that does not reach the analog input voltage Vin during the sampling period according to the clock signal. For example, when the analog input voltage Vin sweeps from the ground voltage (e.g., about 0 V) to the power supply voltage (e.g., about 3.3 V), the ON-resistance between the drain and the source prevents the analog output voltage Vout from reaching the power supply voltage (e.g., about 3.3 V). That is, the first NMOS transistor NM1 cannot operate normally due to the ON-resistance between the drain and the source according to the analog input voltage Vin.

Accordingly, one or more embodiments of the present disclosure propose a structure in which a voltage between the source and the gate of the first NMOS transistor NM1 is maintained greater than or equal to the threshold voltage, and thus, the ON-resistance between the drain and the source is maintained at a minimum value.

The ON-resistance between the drain and the source of the first NMOS transistor NM1 may vary depending on the magnitude of the gate-source voltage Vgs. This can be found by Equations 1 and 2 below.

Equation 1 is for calculating a current $I_d$ between the drain and the source.

$$Id = \mu_n C_{OX} \frac{W}{L}\left[(Vgs - Vth)Vds - \frac{1}{2}Vds^2\right] \quad \text{Equation (1)}$$

$$\approx \mu_n C_{OX} \frac{W}{L}(Vgs - Vth)Vds, \; Vds \ll 2(Vgs - Vth)$$

Here, μn may represent an effective mobility of a charge carrier, and COX may represent a capacitance of a gate oxide layer per unit area. Also, W may represent a width of the gate, and L may represent a length of the gate. Vgs may represent a gate-source voltage, Vth may represent a threshold voltage, and Vds may represent a drain-source voltage of the first NMOS transistor NM1.

Since the current Id between the drain and the source may be calculated by Equation 1, the ON-resistance Ron between the drain and the source may be calculated by Equation 2.

$$Ron = \frac{1}{\mu_n C_{OX} \frac{W}{L}(Vgs - Vth)} \quad \text{Equation (2)}$$

Referring to Equation 2, when process variables have a certain magnitude, the ON-resistance Ron may vary depending on the magnitude of the gate-source voltage Vgs. For example, as the magnitude of the gate-source voltage Vgs increases, the ON-resistance Ron decreases, and when the gate-source voltage Vgs has a certain magnitude, the ON-resistance Ron remains the same value.

Accordingly, in one or more embodiments of the present disclosure, the gate-source voltage Vgs is intended to be kept as large as possible so that the ON-resistance between the drain and the source can be kept as low as possible.

Figure 4:
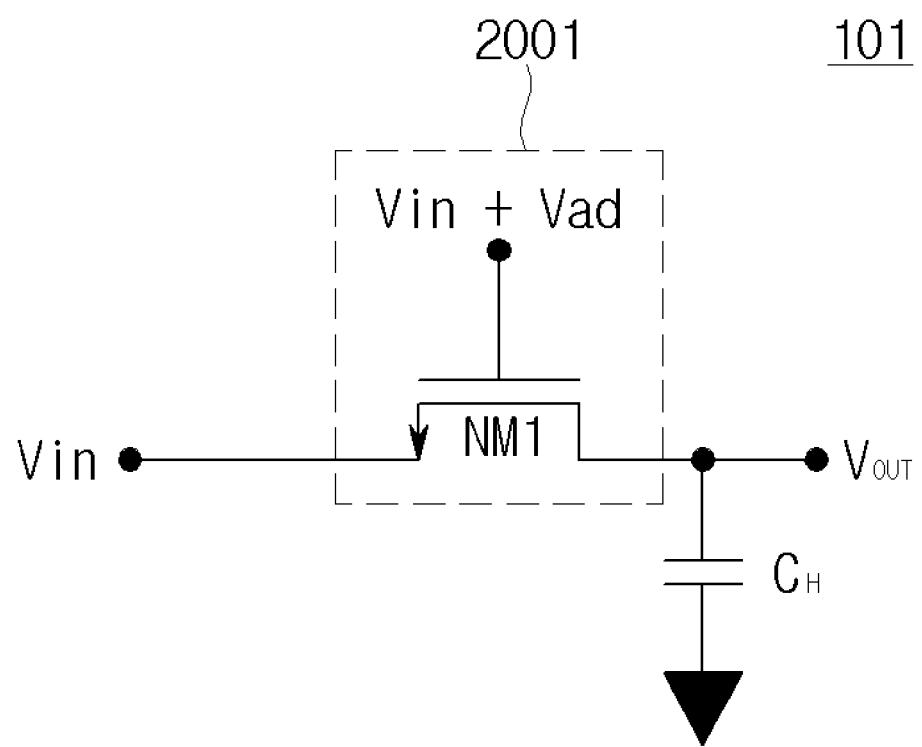
FIG. 4 illustrates a structure of the sample & hold (S&H) circuit including an analog switch according to one or more embodiments of the present disclosure.
Figure 5:
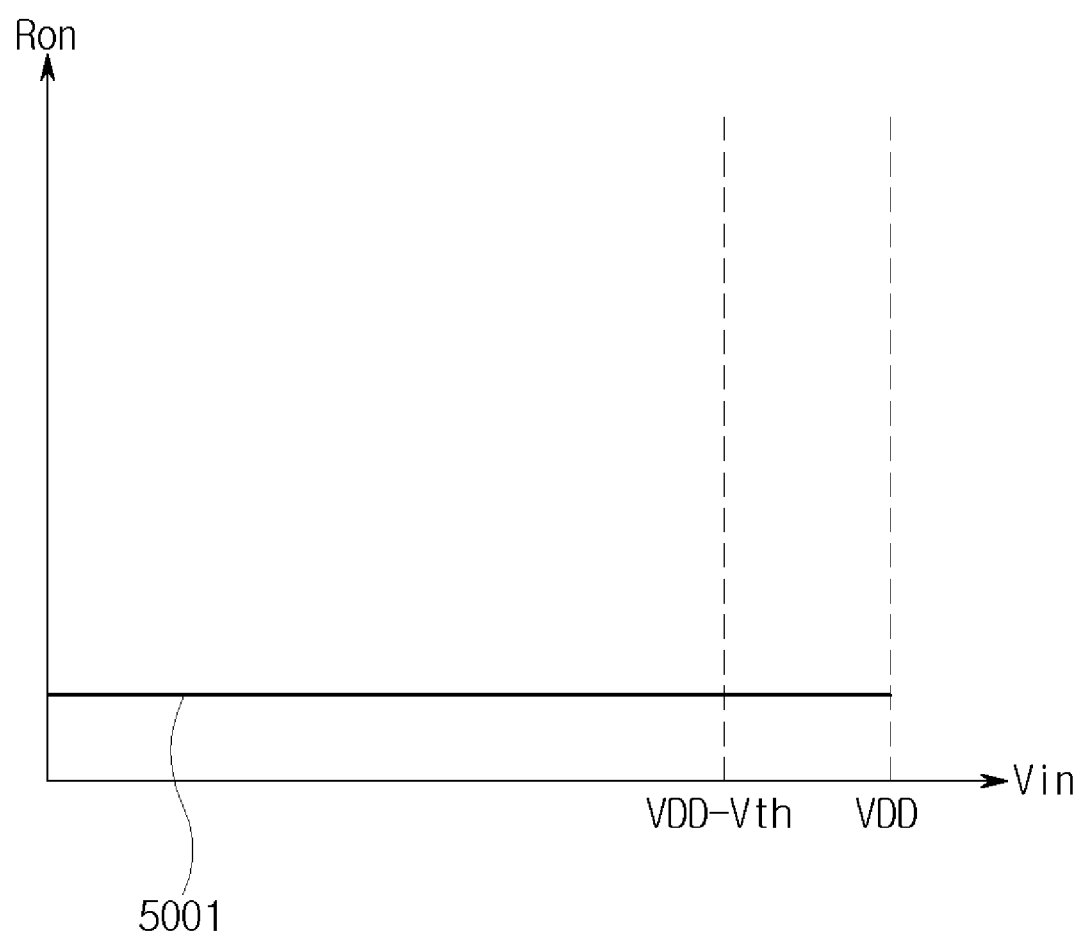
FIG. 5 illustrates a graph showing a relationship between an ON-resistance and an analog input voltage of the analog switch according to one or more embodiments of the present disclosure.

In an example, as shown in FIG. 4, a value (Vin+Vad) obtained by adding the analog input voltage Vin to a constant voltage Vad is provided to the gate of the first NMOS transistor NM1 operating as the analog switch 2001, so that the magnitude of the gate-source voltage Vgs can be maintained as large as possible. In this case, as shown in FIG. 5, the ON-resistance Ron between the drain and the source can remain at a constant value (5001) irrespective of the analog input voltage Vin.

Accordingly, hereinafter, one or more embodiments of the present disclosure will describe a circuit structure of the analog switch 2001 for providing a value (Vin+Vad) obtained by adding the analog input voltage Vin to the constant voltage Vad to the gate of the first NMOS transistor NM1.

Figure 6:
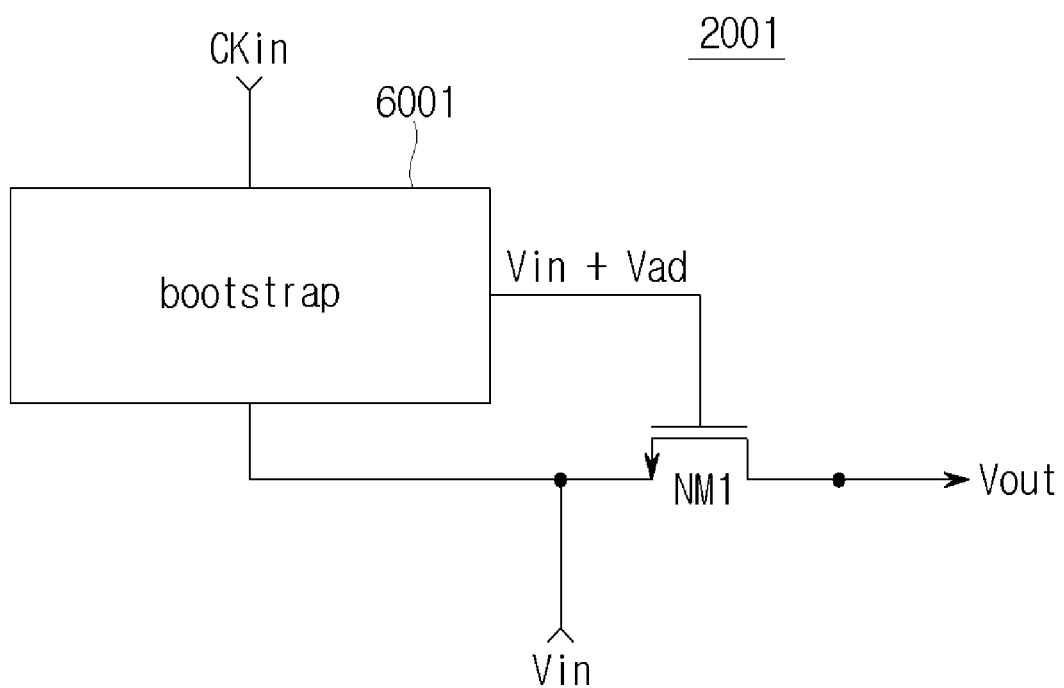
FIG. 6 illustrates a structure of the analog switch according to one or more embodiments of the present disclosure.

FIG. 6 illustrates a structure of the analog switch according to one or more embodiments of the present disclosure.

Referring to FIG. 6, the analog switch 2001 may include a bootstrap 6001 and the first NMOS transistor NM1.

The bootstrap 6001 may receive the analog input voltage Vin and may output a boosting voltage (Vin+Vad) obtained by adding the constant voltage Vad to the analog input voltage Vin according to a clock signal CKin for sample and hold. In an example, the bootstrap 6001 may output the boosting voltage (Vin+Vad) during the sampling period according to the clock signal CKin for sample and hold, and may output a first gate voltage during a holding period. The first gate voltage may be lower than the threshold voltage of the first NMOS transistor NM1.

In an example, the constant voltage Vad added to the analog input voltage Vin may be set to a value greater than the threshold voltage Vth. This is to make the gate-source voltage Vgs of the first NMOS transistor NM1 greater than the threshold voltage in the sampling period.

The gate of the first NMOS transistor NM1 may be connected to the bootstrap 6001. The first NMOS transistor NM1 may be on/off controlled based on a voltage supplied from the bootstrap 6001. In an example, when the boosting voltage is supplied from the bootstrap 6001, the first NMOS transistor NM1 may be turned on and may output the analog output voltage Vout corresponding to the analog input voltage Vin. In an example, when the first gate voltage is supplied from the bootstrap 6001, the first NMOS transistor NM1 may be turned off.

According to one or more embodiments of the present disclosure, as described above, the boosting voltage (Vin+Vad) is supplied to the gate of the first NMOS transistor NM1 during the sampling period, so that the gate-source voltage Vgs becomes the constant voltage Vad. As the gate-source voltage Vgs is maintained at the constant voltage Vad, the ON-resistance between the drain and the source of the first NMOS transistor NM1 may be kept at a low value as shown in FIG. 5.

Figure 7:
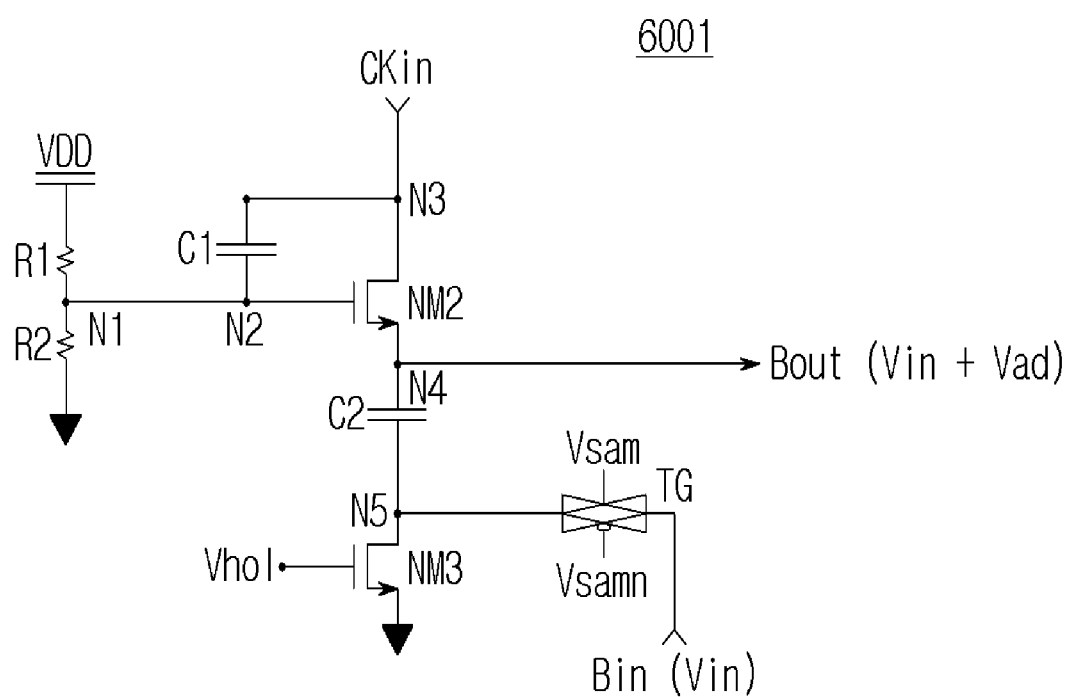
FIG. 7 illustrates an example of a structure of a bootstrap circuit according to one or more embodiments of the present disclosure.
Figure 8:
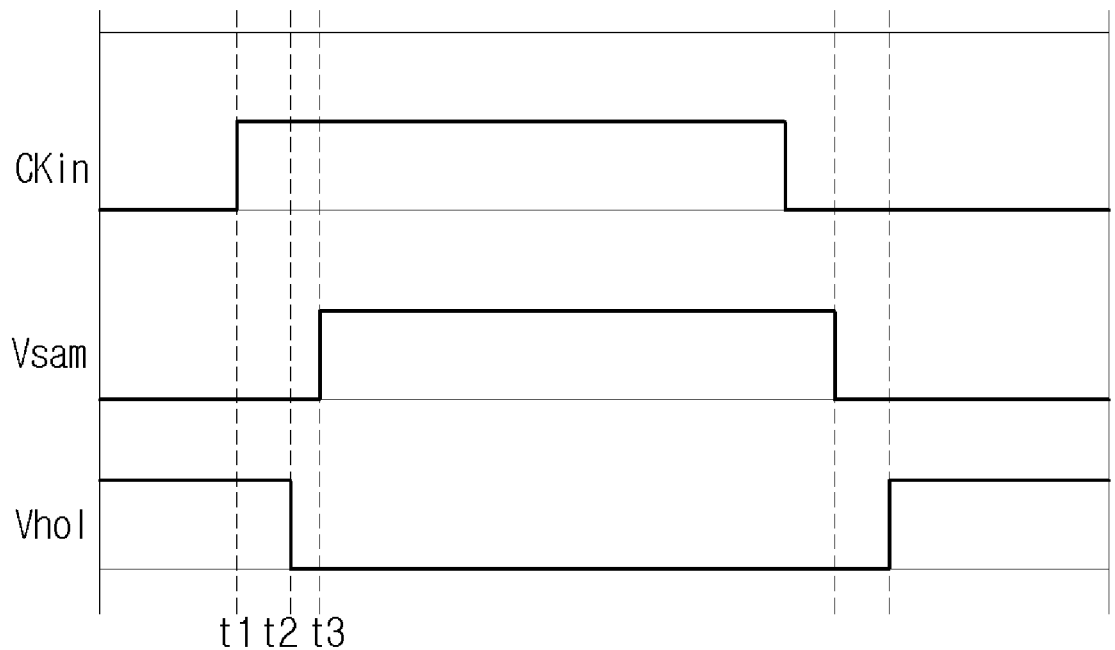
FIG. 8 illustrates a control signal which is applied to a bootstrap according to one or more embodiments of the present disclosure.

FIG. 7 illustrates an example of a structure of a bootstrap circuit according to one or more embodiments of the present disclosure. Here, a description of a control signal provided to the bootstrap 6001 will be described with reference to FIG. 8 illustrating the control signal which is applied to the bootstrap according to one or more embodiments of the present disclosure.

Referring to FIG. 7, the bootstrap 6001 may include a first resistance element R1, a second resistance element R2, a first capacitor C1, a second capacitor C2, and a second NMOS transistor NM2, a third NMOS transistor NM3, and a transmission gate TG.

The first resistance element R1 and the second resistance element R2 may be connected in series between the power supply voltage VDD and the ground.

A gate of the second NMOS transistor NM2 is connected to a first node N1 between the first resistance element R1 and the second resistance element R2, and both ends of the second NMOS transistor NM2 may be connected to a fourth node N4 and a first input terminal to which the clock signal CKin is input. Here, a power supply voltage divided by the first resistance element R1 and the second resistance element R2 may be applied to the gate of the second NMOS transistor NM2. For example, a divided power supply voltage expressed as VDD*R2/(R1+R2) may be applied to the gate of the second NMOS transistor NM2.

The first capacitor C1 may be connected between a second node N2 and a third node N3. The second node N2 may be between the gate of the second NMOS transistor NM2 and the first node, and the third node N3 may be between the drain of the second NMOS transistor NM2 and the first input terminal to which the clock signal CKin is input. Here, the first node N1 and the second node N2 may be electrically the same node.

The second capacitor C2 may be connected between the second NMOS transistor NM2 and the third NMOS transistor NM3. An output terminal Bout of the bootstrap circuit may be connected to the fourth node between the second capacitor C2 and a source terminal of the second NMOS transistor NM2.

Both ends of the third NMOS transistor NM3 may be connected to the second capacitor C2 and the ground. A voltage holding signal Vhol may be input to a gate of the third NMOS transistor NM3.

The transmission gate TG may include a fourth NMOS transistor and a first PMOS transistor which are connected in parallel between a fifth node N5 and the second input terminal Bin to which the analog input voltage Vin is input. Here, a voltage sampling signal Vsam may be input to a gate of the fourth NMOS transistor, and a voltage sampling inversion signal Vsamn may be input to a gate of the first PMOS transistor. The voltage sampling inversion signal Vsamn may be obtained by inverting the voltage sampling signal Vsam. The fifth node N5 may be between the third NMOS transistor NM3 and the second capacitor C2.

Referring to FIG. 8, control signals including a clock signal CKin, a voltage holding signal Vhol, and a voltage sampling signal Vsam may be applied to the bootstrap 6001 described above. Here, the voltage holding signal Vhol and the voltage sampling signal Vsam can maintain a non-overlap state all the time. For example, the voltage holding signal may keep a low level during a time when the voltage sampling signal is at a high level, and the voltage sampling signal may keep a low level during a time when the voltage holding signal is at a high level.

The operation of the bootstrap 6001 of FIG. 7 will be described with reference to the control signals shown in FIG. 8.

Referring to FIG. 8, at a point of time t1, the high-level clock signal CKin may be provided to the first input terminal of the bootstrap 6001, a low-level voltage sampling signal Vsam may be provided to the transmission gate TG, and the high-level voltage holding signal Vhol may be provided to the third NMOS transistor NM3. Accordingly, the second NMOS transistor NM2 and the third NMOS transistor NM3 may be turned on, and the transmission gate TG may be turned off.

The high-level clock signal CKin may flow to the ground through the second NMOS transistor NM2 and the third NMOS transistor NM3 which are in the on-state. Here, the constant voltage Vad may be charged in the second capacitor C2 connected between the second NMOS transistor NM2 and the third NMOS transistor NM3. As the second capacitor C2 is charged with the constant voltage (the voltage of the node N1–the threshold voltage Vth), the magnitude of the gate-source voltage Vgs of second NMOS transistor NM2 is equal to or lower than the threshold voltage. When the magnitude of the gate-source voltage Vgs of the second NMOS transistor NM2 is equal to or lower than the threshold voltage, the second NMOS transistor NM2 may be turned off.

Next, at a point of time t2, the low-level voltage holding signal Vhol may be provided to the third NMOS transistor NM3. Accordingly, the third NMOS transistor NM3 may be turned off. If the third NMOS transistor NM3 is not turned off after the second NMOS transistor NM2 is turned off, electric charges charged in the second capacitor C2 may flow out through the third NMOS transistor NM3. Accordingly, by turning off the third NMOS transistor NM3, the voltage charged in the second capacitor C2 (the voltage of the node N1–the threshold voltage Vth) may be maintained as it is.

Next, at a point of time t3, the high-level voltage sampling signal Vsam may be provided to the transmission gate TG. Here, the high-level voltage sampling signal Vsam is provided to the gate of the fourth NMOS transistor included in the transmission gate TG, and the low-level voltage sampling inversion signal Vsamn is provided to the gate of the first PMOS transistor included in the transmission gate TG. When the high-level voltage sampling signal Vsam is provided to the transmission gate TG, the transmission gate TG may be turned on. Here, since the second NMOS transistor NM2 and the third NMOS transistor NM3 are in an off-state, the analog input voltage Vin applied to the second input terminal Bin of the bootstrap 6001 may be added to the constant voltage Vad charged in the second capacitor C2 through the transmission gate TG and may be provided to an output terminal of the bootstrap 6001. The boosting voltage (Vin+Vad) obtained by adding the constant voltage Vad to the analog input voltage Vin may be provided to the gate of the first NMOS transistor NM1 of FIG. 6.

By providing the boosting voltage (Vin+Vad) to the gate of the first NMOS transistor NM1, the gate-source voltage Vgs of the first NMOS transistor NM1 may be kept at the constant voltage Vad. For example, assuming that the constant voltage Vad is about 2.0 V, when the analog input voltage is about 0.1 V, the gate of the first NMOS transistor NM1 may be provided with a voltage of about 2.1 V (=0.1 V+2.0 V). Also, when the analog input voltage is about 3.3 V, the gate of the first NMOS transistor NM1 may be provided with a voltage of about 5.3 V (=3.3V+2.0V). That is, although the analog input voltage has two different values of 0.1 V and 3.3 V, the gate-source voltage Vgs of the first NMOS transistor NM1 may be kept at the same value of about 2.0 V. Accordingly, the first NMOS transistor NM1 can keep a turned-on state, and the ON-resistance between the drain and the source of the first NMOS transistor NM1 may be kept at a low value, as shown in FIG. 5.

Figure 9:
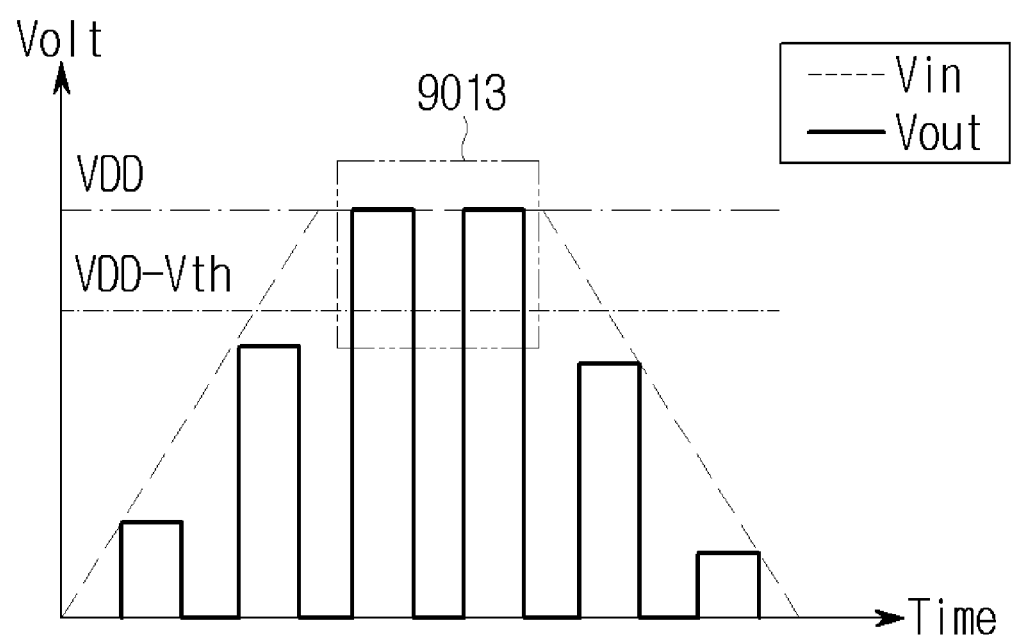
FIG. 9 illustrates a graph showing a relationship between an analog input voltage and an analog output voltage of the analog switch according to one or more embodiments of the present disclosure.

Accordingly, the first NMOS transistor NM1 can operate normally all the time regardless of the magnitude of the analog input voltage Vin. For example, as shown in FIG. 9, even when the analog input voltage Vin is greater than a specified voltage value (9013), the first NMOS transistor NM1 may output the analog output voltage Vout corresponding to the analog input voltage Vin during the sampling period according to the clock signal.

Figure 10:
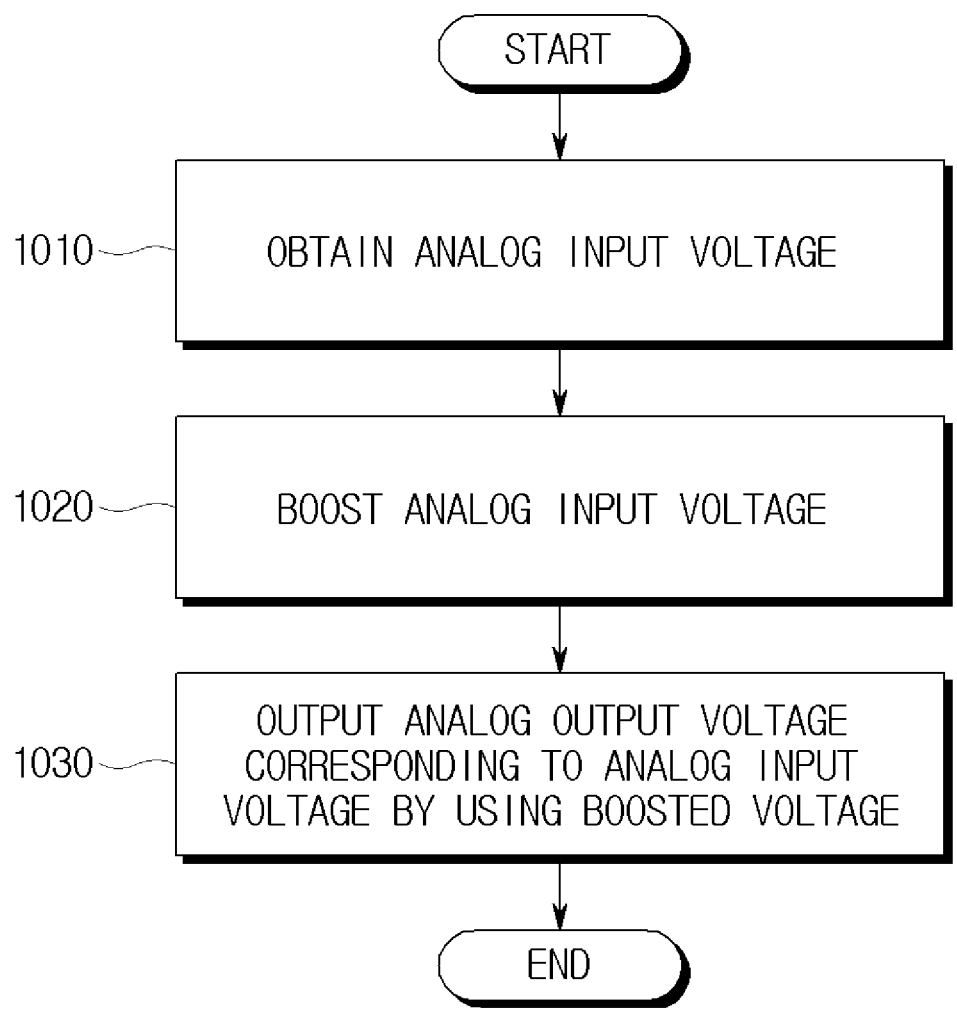
FIG. 10 illustrates a flowchart showing an operation of the analog switch according to one or more embodiments of the present disclosure.

FIG. 10 illustrates a flowchart showing an operation of the analog switch according to one or more embodiments of the present disclosure. In the following embodiment, respective steps may be sequentially performed, and may not be necessarily performed sequentially. For example, the order of the respective steps may be changed, and at least two steps may be performed in parallel. Here, the analog switch 2001 may include, as shown in FIG. 6, the bootstrap 6001 and the NMOS transistor NM1.

Referring to FIG. 10, in step 1010, the analog switch 2001 may receive an analog input voltage.

In step 1020, the analog switch 2001 may boost the analog input voltage. For example, the analog switch 2001 may generate the boosting voltage (Vin+Vad) obtained by adding the constant voltage Vad to the analog input voltage Vin by using the bootstrap 6001. Here, the bootstrap 6001 may be configured as shown in FIG. 7.

In step 1030, the analog switch 2001 may output the analog output voltage corresponding to the analog input voltage by using the boosting voltage. In an example, the analog switch 2001 may provide the boosting voltage (Vin+Vad) generated by the bootstrap 6001 to a gate of the first NMOS transistor NM1. When the boosting voltage (Vin+Vad) is input to the gate of the first NMOS transistor NM1, the gate-source voltage Vgs may be maintained at the constant voltage Vad. Accordingly, the ON-resistance between the drain and the source of the first NMOS transistor NM1 may be kept at a minimum value, and thus, the first NMOS transistor NM1 may output the analog output voltage corresponding to the input analog input voltage. The output voltage output from the analog switch 2001 may be stored in the capacitor CH included in the sample and hold circuit 101 and then may be provided to the comparator 110.

The following Table 1 shows the performance of the ADC provided with a general analog switch shown in FIG. 2 and the performance of the ADC provided with the analog switch proposed in the present disclosure shown in FIG. 6.

TABLE 1

| Performance | SNR (dB) | SNDR (dB) | THD (−dB) | ENOB (bit) |
| --- | --- | --- | --- | --- |
| ADC having a general structure | 23 | 9 | 10 | 1.26 |
| ADC having a proposed structure | 61 | 59 | 61 | 9.4 |

In Table 1, SNR means analog signal-to-noise ratio, and SNDR means analog signal-to-noise and harmonic distortion ratio. THD stands for total harmonic distortion ratio, and ENOB stands for effective number of bits excluding noise and harmonic distortion. Referring to Table 1, it can be seen that the ADC having an analog switch structure proposed in the present disclosure has higher performance than the ADC having a general structure. For example, it can be seen that while the SNR of the ADC having the general structure is 23 dB, the SNR of the ADC with the proposed structure is 61 dB, which is greater than that of the ADC with the general structure.

In the above description, the bootstrap 6001 that generates and outputs the boosting voltage has been described as a component of the analog switch 2001, and the bootstrap 6001 may be a separate component that supplies the boosting voltage to the analog switch 2001. When the bootstrap 6001 and the analog switch 2001 are separate components, the analog switch 2001 may include only the NMOS switch composed of the first NMOS transistor NM1.

In the above description, the first capacitor C1 and/or the second capacitor C2 may be manufactured by a general planar capacitor or may be manufactured by using a metal-oxide-semiconductor capacitor (MOS CAP). For example, since the first capacitor C1 and the second capacitor C2 do not require high precision, they can be manufactured as MOS CAPs that do not require a separate process and can obtain a relatively large capacitance in a small area.

In FIGS. 2 to 10 described above, the sample and hold circuit 101 of the ADC, in particular, the analog switch 2001 included in the sample and hold circuit 101 has been described.

Hereinafter, components (e.g., the comparator 110, the SAR 120, and the DAC 130) at the rear of the sample and hold circuit 101 shown in FIG. 1 will be described with reference to FIGS. 11 to 14. Hereinafter, a first analog input signal Vin1 (or the first analog input voltage) which is described with reference to FIGS. 11 to 14 may be the analog output voltage Vout output from the sample and hold circuit 101.

The SAR-type ADC 100 shown in FIG. 1 may convert an analog signal into a digital signal based on the DAC 130 and the comparator 110. However, various noise components exist in an actual environment, and the various noise components may affect the output signal of the DAC 130. This may degrade the performance of the SAR-type ADC 100. For example, the analog signal output from the reference voltage ladder of the DAC 130 may be a signal in which various noise components such as power noise, ground noise, or noises caused by external influences are reflected. The SAR-type ADC 100 may output incorrect digital signal data based on the output signal of the DAC 130 in which the noise component is reflected.

For example, in an ideal situation without noise, if an analog input signal is "4.5 mV" and a digital signal value stored in the three-bit SAR 120 is "101", the DAC 130 may output an analog signal of "5 mV" corresponding to the digital signal value "101" based on the reference voltage ladder. Here, the comparator 110 may output a low signal because the analog input signal of "4.5 mV" input through the first input terminal is smaller than the output signal of the "5 mV" of the DAC 130 input through the second input terminal.

However, in the presence of noise, if an analog input signal is "4.5 mV" and a digital signal value stored in the three-bit SAR 120 is "101", the DAC 130 may output an analog signal of "4 mV" in which a noise component ($\Delta$Vnoise=−1 mV) is reflected instead of an analog signal of "5 mV" corresponding to the digital signal value "100", based on the reference voltage ladder. Here, the comparator 110 may output a high signal because the analog input signal of "4.5 mV" input through the first input terminal is greater than the output signal of the "4 mV" of the DAC 130 input through the second input terminal. That is, as the DAC outputs the analog signal in which the noise component is reflected, the comparator outputs the opposite result to the ideal situation without noise, which leads to degradation of the performance of the SAR-type ADC.

Accordingly, in one or more embodiments of the present disclosure, an analog-to-digital converter having high performance even in the presence of noise and an operation method thereof will be described.

Figure 11:
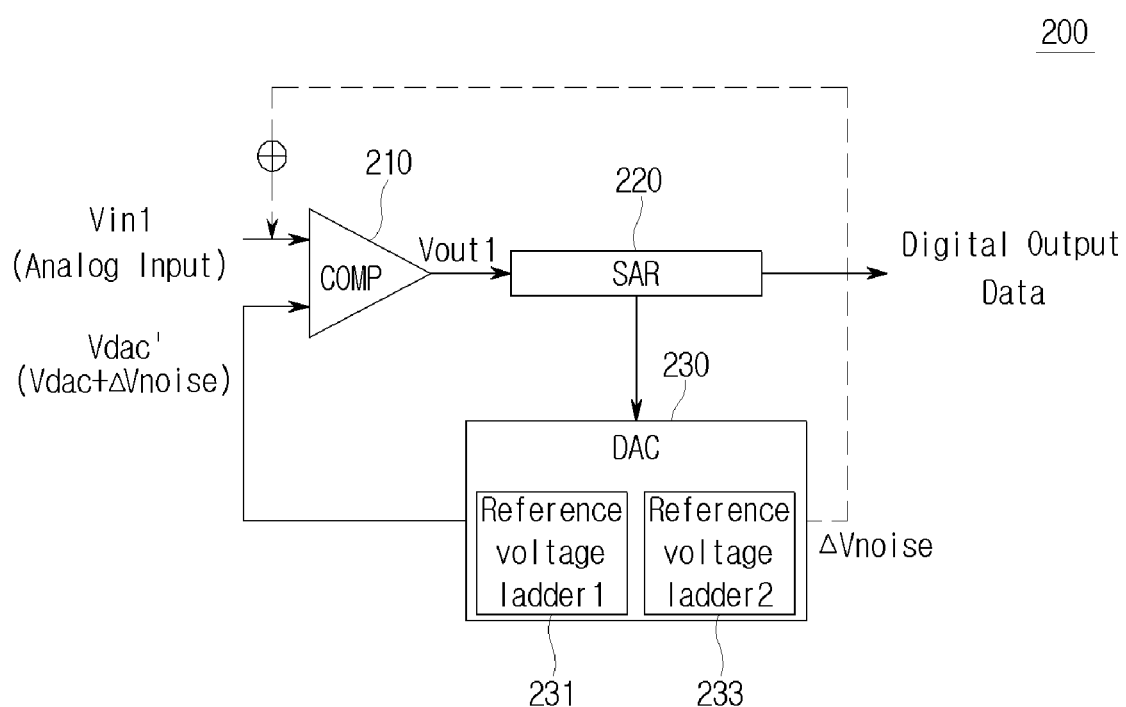
FIG. 11 illustrates a structure of an SAT type ADC according to one or more embodiments of the present disclosure.
Figure 12A:
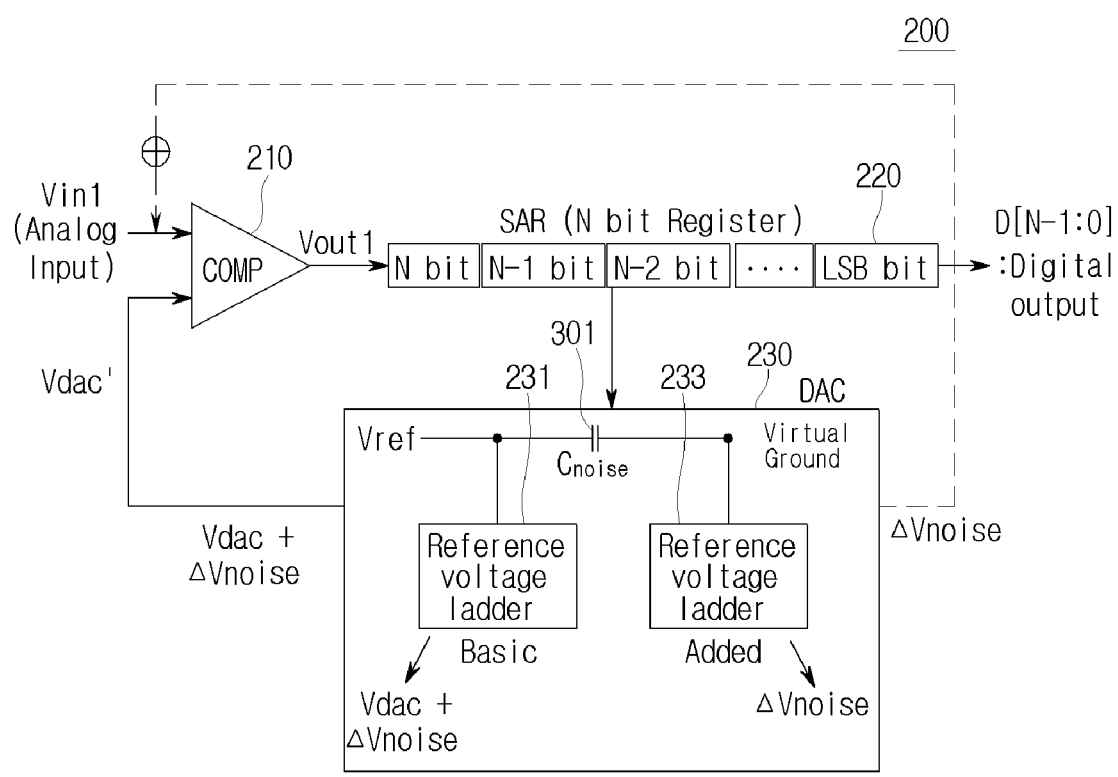
FIG. 12A illustrates an example of an N-bit SAT type ADC according to one or more embodiments of the present disclosure.
Figure 12B:
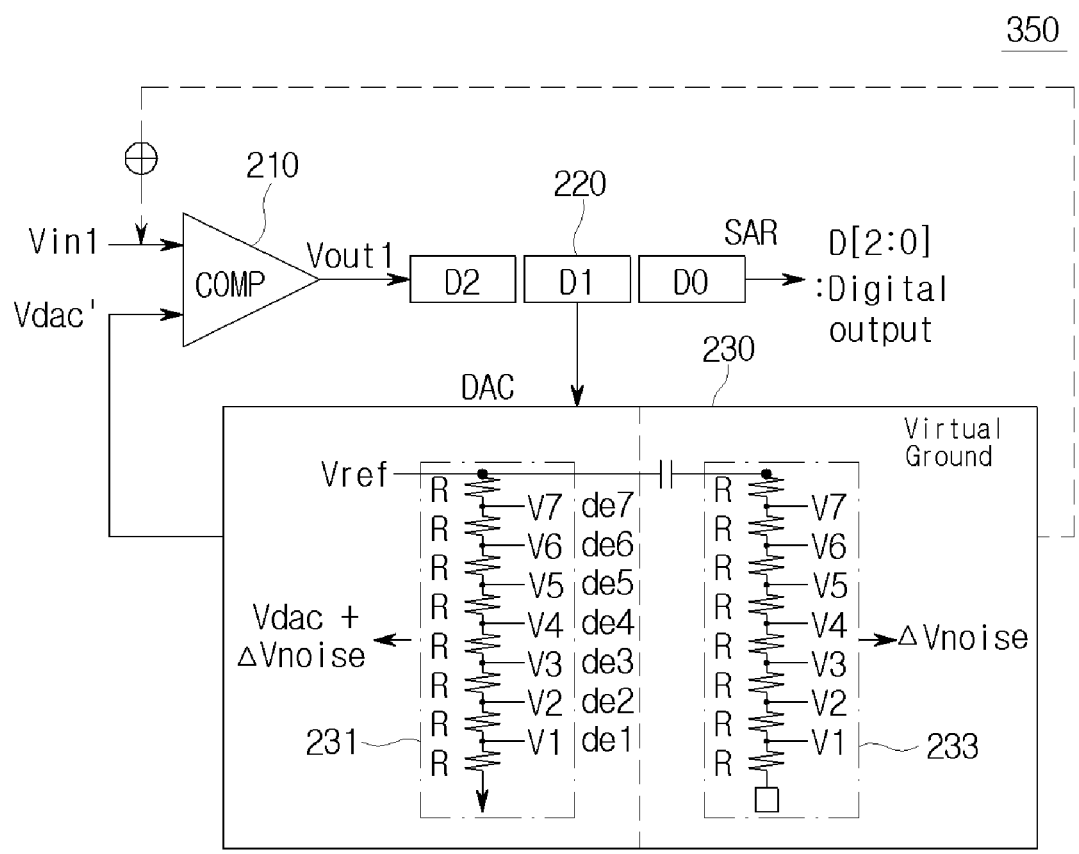
FIG. 12B illustrates an example of a structure of a digital-to-analog converter (DAC) in a 3-bit SAT type ADC according to one or more embodiments of the present disclosure.

FIG. 11 illustrates a structure of the SAR type ADC 200 according to one or more embodiments of the present disclosure. Hereinafter, some components of the SAR-type ADC 200 will be described with reference to FIGS. 12A and 12B. FIG. 12A illustrates an example of an N-bit SAR type ADC according to one or more embodiments of the present disclosure. FIG. 12B illustrates an example of a structure of the DAC in a 3-bit SAR type ADC 350 according to one or more embodiments of the present disclosure.

Referring to FIG. 11, the SAR-type ADC 200 according to one or more embodiments of the present disclosure may include a comparator 210, a successive approximation register (SAR) 220, and a digital-to-analog converter (DAC) 230.

In an example, the comparator 210 may compare an analog signal (or voltage) input through a first input terminal with an analog signal input through a second input terminal, and may output a high or low digital signal Vout1 according to the comparison result. In an example, the analog signal input through the first input terminal of the comparator 210 may be a signal (Vin1+$\Delta$Vnoise) obtained by adding an analog signal $\Delta$Vnoise having a noise component output from the DAC 230 to the first analog input signal Vin1. The first analog input signal Vin1 may refer to an analog signal input through an input terminal of the SAR-type ADC 200. In an example, a signal Vdac' input through the second input terminal of the comparator 210 is a signal output from the DAC 230 and may be an analog signal (Vdac+$\Delta$Vnoise) in which a noise component is reflected. The comparator 210 may output a high signal when the analog signal (Vin1+$\Delta$Vnoise) input through the first input terminal is greater than the analog signal (Vdac+$\Delta$Vnoise) input through the second input terminal (that is, (Vin1+$\Delta$Vnoise)>(Vdac+$\Delta$Vnoise)). The comparator 210 may output a low signal when the analog signal (Vin1+$\Delta$Vnoise) input through the first input terminal is smaller than the analog signal (Vdac+$\Delta$Vnoise) input through the second input terminal (that is, (Vin1+$\Delta$Vnoise)<(Vdac+$\Delta$Vnoise)).

In an example, the SAR 220 includes an N-bit register, and thus, may continuously store digital signal values from the most significant bit (MSB) to the least significant bit (LSB) based on the digital signal output from the comparator 210, and may output the stored value as a digital signal data (digital output data).

In an example, the DAC 230 may convert the digital signal value stored in the SAR 220 into an analog signal according to a reference voltage and may output it. In an example, the DAC 230 may output an analog signal corresponding to the digital signal value according to the reference voltage based on a reference voltage ladder1 231. Here, the output analog signal Vdac' may be a signal (Vdac+$\Delta$Vnoise) to which a noise component applied to the reference voltage ladder1 is applied. Here, Vdac means an analog signal output that the DAC 230 outputs for a first digital signal value by using the reference voltage ladder1, in an ideal situation in which no noise component is applied to the reference voltage ladder1.

$\Delta$Vnoise may be an analog signal corresponding to the noise component applied to the reference voltage ladder1 in an actual situation in which noise components exist. In an example, the reference voltage ladder1 231 may be formed in the form of a resistance type including a plurality of resistance elements, of a condenser type including a plurality of condensers, or a combination thereof.

In an example, the DAC 230 may output the analog signal $\Delta$Vnoise corresponding to the noise component applied to the reference voltage ladder1 based on a reference voltage ladder2 233. The analog signal $\Delta$Vnoise having the noise component output based on the reference voltage ladder2 233 may be provided to the first input terminal of the comparator and may be added to the analog input signal. In an example, the analog signal $\Delta$Vnoise having the noise component may be added to the analog input signal input to the SAR-type DAC 200 through an adder. In an example, the reference voltage ladder2 233 may be formed in the same structure as that of the reference voltage ladder1 231 in such a way as to have the same resistance value as that of the reference voltage ladder1 231. For example, when the reference voltage ladder1 231 is composed of a plurality of resistance elements, the reference voltage ladder2 233 may be composed of a plurality of resistance elements in the same way as the reference voltage ladder1 231. For another example, when the reference voltage ladder1 231 is composed of a plurality of condensers, the reference voltage ladder2 233 may be composed of a plurality of condensers in the same way as the reference voltage ladder 1 231. In another example, when the reference voltage ladder1 231 is formed in the form of a combination of a plurality of resistance elements and a plurality of condensers, the reference voltage ladder2 233 may be formed in the form of a combination of a plurality of resistance elements and a plurality of condensers in the same way as the reference voltage ladder1 231.

In an example, the reference voltage ladder1 231 and the reference voltage ladder2 233 may be connected through a condenser 301, as shown in FIG. 12A. The reference voltage ladder2 233 is connected with the reference voltage ladder1 231 through the capacitor 301, so that the reference voltage ladder2 233 may receive, through the capacitor 301, the noise component applied to the reference voltage ladder1 231. In an example, a node between the reference voltage ladder2 233 and the capacitor 301 may be virtually grounded.

In an example, the reference voltage ladder1 231 and the reference voltage ladder2 233 are configured to have the same structure with the same elements. However, one end of the reference voltage ladder1 231 may be connected to the ground, and one end of the reference voltage ladder2 233 may be open. Here, the opening of the reference voltage ladder2 means a floating state. For example, as shown in FIG. 12B, while the reference voltage ladder1 231 and the reference voltage ladder2 233 have the same structure including a plurality of resistance elements, one end of the reference voltage ladder1 231 may be connected to the ground, and one end of the reference voltage ladder2 233 may be open. Here, the opening of the reference voltage ladder2 means a floating state.

In an example, the reference voltage ladder2 233 may output an analog signal corresponding to a virtual ground value in a state in which the noise component is not applied to the reference voltage ladder1 231. In an example, when the noise component is applied to the reference voltage ladder1 231, the reference voltage ladder2 233 receives, through the condenser 301, the noise component applied to the reference voltage ladder1 231, thereby outputting the analog signal ΔVnoise corresponding to the noise component.

Hereinafter, examples of operations of the SAR-type ADC proposed in the present disclosure will be described with reference to FIG. 12B as follows. Here, for convenience of description, it is assumed that the SAR includes a three-bit register. Also, for convenience of description, it is assumed that noise is applied in a step of determining the value of the least significant bit among steps of determining the values from the most significant bit to the least significant bit of the three-bit SAR. However, one or more embodiments of the present disclosure may be applied in the same manner even when noise is applied in all of the steps of determining the values the most significant bit to the least significant bit.

Referring to FIG. 12B, the first analog input signal Vin1 of 4.5 mV may be input to the SAR-type ADCs 200 and 350. Here, the SAR 220 may perform a preset operation to set the value of the most significant bit D2 to "high" and sets the values of the remaining lower-order bits D1 and D0 to "low". Depending on the preset operation, the digital signal value stored in the SAR 200 may be "100".

The DAC 230 designates a value de4 corresponding to the digital signal value "100" stored in the SAR 220 by using an internal decoder, thereby outputting an analog signal corresponding to "100" through the reference voltage ladder1 231. Since no noise component is applied to the reference voltage ladder1 231, the DAC 230 may output an analog signal of 4 mV (Vdac=4 mV) corresponding to "100" through the reference voltage ladder1 231. Here, the reference voltage ladder2 233 of the DAC 230 may output an analog signal corresponding to the virtual ground value. Since no noise component is applied to the reference voltage ladder1 231, the reference voltage ladder2 233 may output an analog signal of 0 mV.

The comparator 210 may compare the analog signal of 4.5 mV input through the first input terminal and the analog signal of 4 mV, that is, the output signal of the DAC 230, input through the second input terminal. Since the value of the analog signal input through the first input terminal is greater, the comparator 210 may output "high".

The SAR 220 may set the value of the most significant bit D2 to "high" based on the fact that the output of the comparator 210 is "high".

Next, the SAR 220 may preset values of the remaining bits other than the set most significant bit. In order to determine the value of the second most significant bit D1, the SAR 200 may preset the value of the second most significant bit D1 to "high" and the value of the least significant bit D0 to "low".

Depending on the setting of the most significant bit and the preset operation to set other bits other than the most significant bit, the digital signal value stored in the SAR 200 may be "110".

The DAC 230 designates a value de6 corresponding to the digital signal value "110" stored in the SAR 220 by using an internal decoder, thereby outputting an analog signal corresponding to "110" through the reference voltage ladder1 231. Since no noise component is applied to the reference voltage ladder1 231, the DAC 230 may output an analog signal of 6 mV (Vdac=6 mV) corresponding to "110" through the reference voltage ladder1 231. Here, the reference voltage ladder2 233 of the DAC 230 may output an analog signal corresponding to the virtual ground value. Since no noise component is applied to the reference voltage ladder1 231, the reference voltage ladder2 233 may output an analog signal of 0 mV.

The comparator 210 may compare the analog signal of 4.5 mV input through the first input terminal and the analog signal of 6 mV, that is, the output signal of the DAC 230, input through the second input terminal. Since the value of the analog signal input through the first input terminal is smaller than the value of the signal input through the second input terminal, the comparator 210 may output "low".

The SAR 220 may set the value of the second most significant bit D1 to "low" based on the fact that the output of the comparator 210 is "low".

Next, the SAR 220 may preset the value of the least significant bit D0, that is the remaining bit other than the set most significant bit D2 and the second most significant bit D1. In order to determine the value of the least significant bit D0, the SAR 200 may preset the value of the least significant bit D0 to "high".

Depending on the setting of the most significant bit and the second most significant bit and the preset operation to set the least significant bit, the digital signal value stored in the SAR 200 may be "101".

The DAC 230 designates a value de5 corresponding to the digital signal value "101" stored in the SAR 220 by using an internal decoder, thereby outputting an analog signal corresponding to "101" through the reference voltage ladder1 231. Here, since the noise component is applied to the reference voltage ladder1 231, the DAC 230 may output the analog signal of 4 mV(5 mV(Vdac)+(−1 mV(ΔVnoise))) which has been changed by the influence of the noise component instead of an analog signal of 5 mV corresponding to "101" through the reference voltage ladder1 231. Here, the reference voltage ladder2 233 of the DAC 230 receives the noise component applied to the reference voltage ladder1 231 through the condenser 301, and thus may output an analog signal of −1 mV corresponding to the noise component. The analog signal of −1 mV having the noise component output from the reference voltage ladder2 233 may be added to the first analog input signal Vin1 and input to the first input terminal of the comparator 210.

The comparator 210 may receive, through the first input terminal, an analog signal of 3.5 mV (4.5 mV(Vin1)+(−1 mV (ΔVnoise))) obtained by adding the analog input signal Vin of 4.5 mV and an analog signal of 1 mV having the noise component output from the DAC 230. The comparator 210 may compare the analog signal of 3.5 mV input through the second input terminal and the analog signal of 4 mV(5 mV(Vdac)+(−1 mV(ΔVnoise))), that is, the output signal of the DAC 230. Since the value of the analog signal input through the first input terminal is smaller than the value of the analog signal input through the second input terminal (Vin1+ΔVnoise<Vdac+ΔVnoise), the comparator 210 may output "low".

The SAR 220 may set the value of the least significant bit D0 to "low" based on the fact that the output of the comparator 210 is "low".

Finally, the SAR 220 may output a final digital data of "100".

As described above, in the SAR-type ADC according to one or more embodiments of the present disclosure, the same noise component is applied to analog signals which are input to both ends of the comparator 210, so that the influence by the noise component in the comparator 210 can be cancelled. That is, in the SAR-type ADC according to one or more embodiments of the present disclosure, even if noise is generated in the DAC, the comparator 210 is able to output a result signal based on the difference between the first analog input signal (Vin1) and the output signal (Vdac) of the internal DAC, without being affected by the noise In FIG. 12B described above, it is assumed that the DAC 230 is a resistor type DAC (RDAC) including the reference voltage ladders 231 and 233 composed of resistance elements. However, in an example, the reference voltage ladder1 231 and the reference voltage ladder2 233 of the DAC may be formed to include both the condenser and resistance elements. In an example, in an n-bit SAR-type ADC, the DAC may be composed of the resistor type DAC (RDAC) which is responsible for higher-order "a" bits and a capacitor type DAC (CDAC) which is responsible for lower-order b(n−a) bits. Conversely, in the n-bit SAR-type ADC, the DAC may be composed of the CDAC which is responsible for the higher-order "a" bits and the RDAC which is responsible for the lower-order b(n−a) bits.

Figure 13:
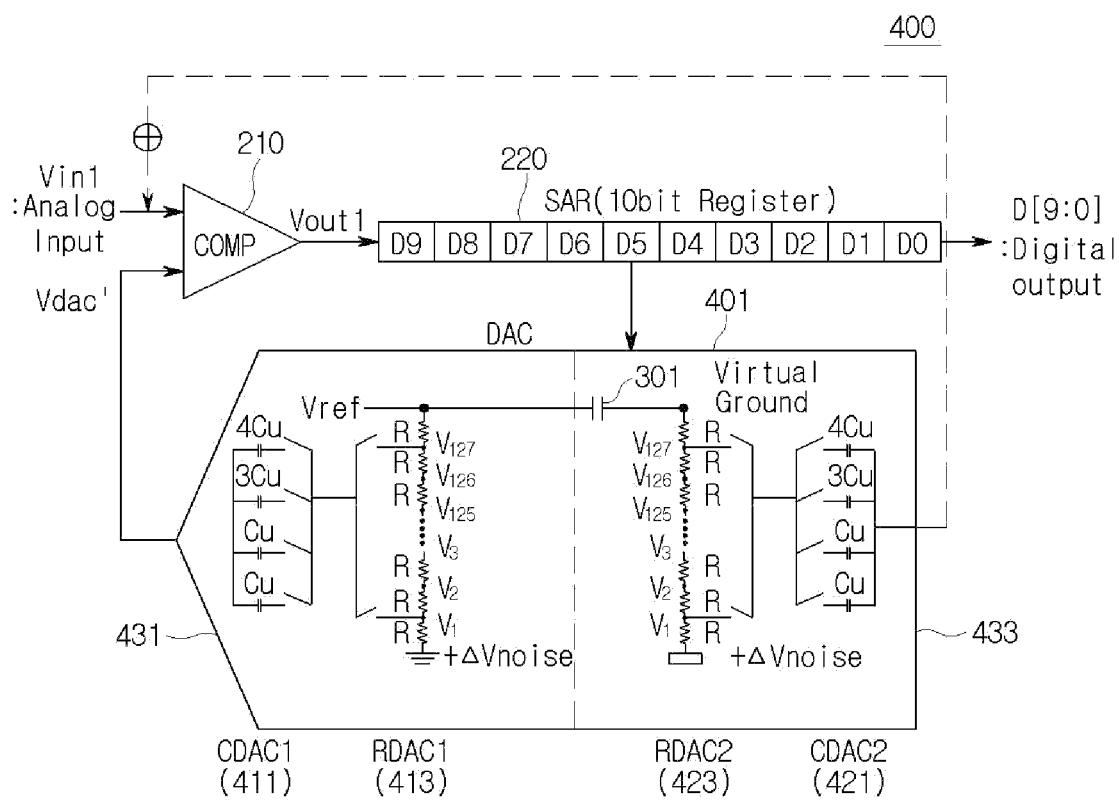
FIG. 13 illustrates an example of a structure of the DAC in a 10-bit SAT type ADC according to one or more embodiments of the present disclosure.

FIG. 13 illustrates an example of a structure of the DAC in a 10-bit SAR type ADC according to one or more embodiments of the present disclosure.

As shown in FIG. 13, a DAC 401 may include a reference voltage ladder1 431 composed of a RDAC1 413 which is responsible for higher-order seven bits and a CDAC1 411 which is responsible for lower-order three bits, and a reference voltage ladder2 433 composed of a RDAC2 423 which is responsible for the higher-order seven bits and a CDAC2 421 which is responsible for the lower-order three bits. The SAR-type ADC shown in FIG. 13 differs from the embodiment of FIG. 12B only in that the reference voltage ladder1 and the reference voltage ladder2 are composed of resistance elements and condensers, and other structures and/or operation methods may be the same as described with reference to FIGS. 11 to 12B. For example, the reference voltage ladder1 431 and the reference voltage ladder2 433 are, as described in FIGS. 11 to 12B, connected through the capacitor 301, and one end of the reference voltage ladder1 431 may be connected to the ground and one end of the reference voltage ladder2 433 may be opened. Also, the reference voltage ladder2 433 may receive a voltage component applied to the reference voltage ladder1 431 through the capacitor 301, thereby outputting an analog signal corresponding to the noise component.

Figure 14:
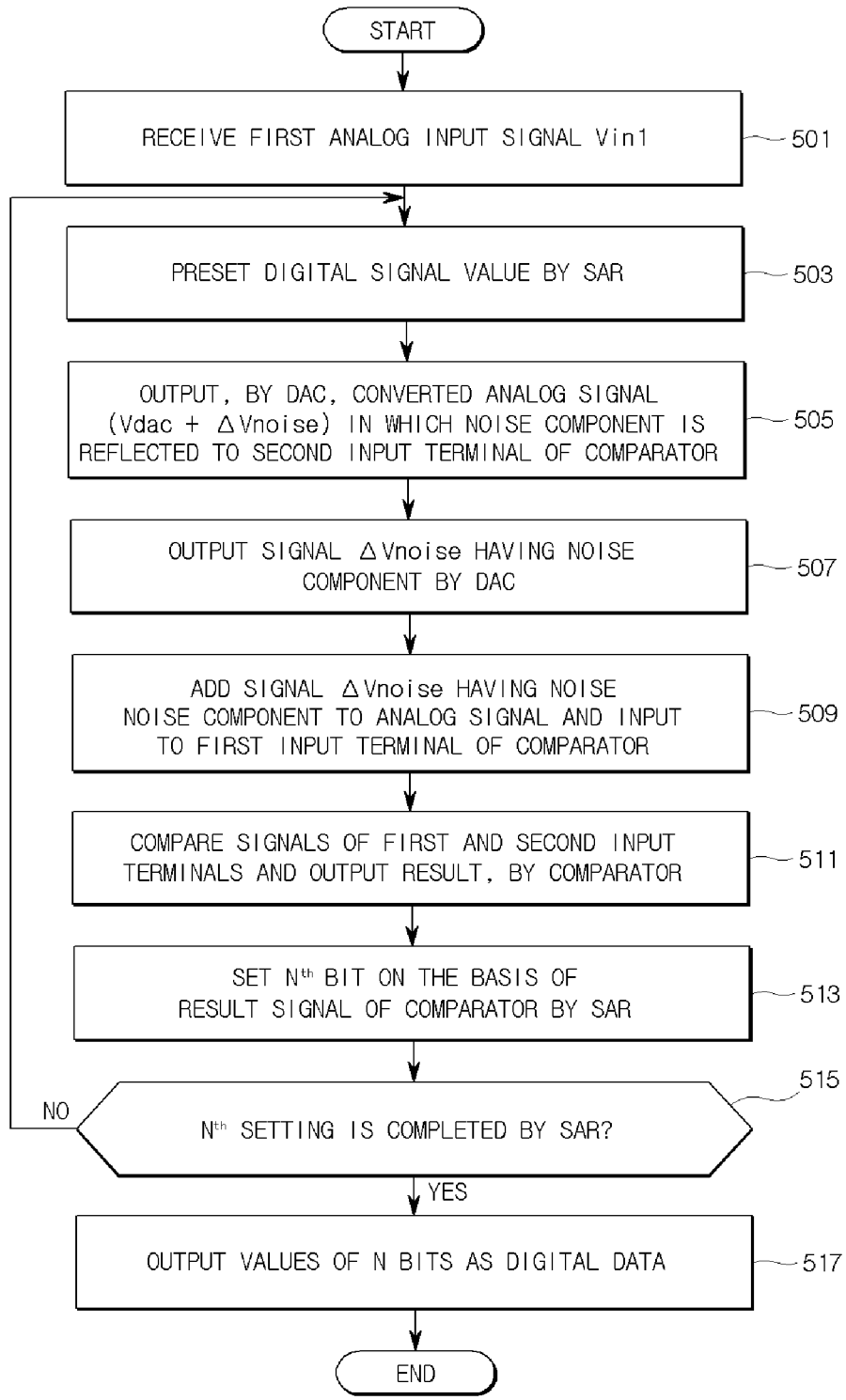
FIG. 14 illustrates a flowchart showing that an analog signal is converted into a digital signal in the SAR-type ADC according to one or more embodiments of the present disclosure.

FIG. 14 illustrates a flowchart showing that an analog signal is converted into a digital signal in the SAR-type ADC according to one or more embodiments of the present disclosure. In the following embodiment, respective steps may be sequentially performed, and may not be necessarily performed sequentially. For example, the order of the respective steps may be changed, and at least two steps may be performed in parallel. Here, the SAR-type ADC may be the SAR-type ADC described with reference to FIGS. 11, 12A, 12B, and/or 13.

Referring to FIG. 14, in step 501, the SAR-type ADC may receive the first analog input signal Vin1. The first analog input signal Vin1 may be provided to the first input terminal of the comparator 210.

In step 503, the SAR 220 of the SAR-type ADC may perform a preset operation from the most significant bit to the least significant bit of the N-bit register. In an example, the SAR 220 may preset the value of the bit, which is to be set, to "high", and then may set the next lower-order bits to "low". For example, in the step of setting the MSB (most significant bit), the value of the MSB may be preset to "high", and the remaining bits may be preset to "low". As another example, in the step of setting the second most significant bit, the value of the second most significant bit may be preset to "high" and the subsequent lower bits may be preset to "low".

In step 505, the DACs 230 and 401 of the SAR-type ADC may output an analog signal (Vdac+ΔVnoise) in which the noise component is reflected to the second input terminal of the comparator. In an example, the DACs 230 and 401 may convert the digital signal value set in the SAR into an analog signal according to the reference voltage by using the reference voltage ladders1 231 and 431. Here, a noise component may be applied to the reference voltage ladders1 231 and 431, and the analog signal converted by reflecting the noise component may be output by the reference voltage ladders1 231 and 431.

In step 507, the DACs 230 and 401 of the SAR-type ADC may output the signal ΔVnoise having a noise component. In an example, the DACs 230 and 401 may output an analog signal corresponding to the noise component by using the reference voltage ladders2 233 and 433 through the reference voltage ladders1 231 and 431 and the condenser 301. For example, the reference voltage ladders2 233 and 433 receive, through the condenser 301, the noise component applied to the reference voltage ladders1 231 and 431, thereby outputting the analog signal corresponding to the noise component. When no noise component is applied to the reference voltage ladders1 231 and 431, the reference voltage ladders2 233 and 433 may output a virtual ground value.

In step 509, the SAR-type ADC may add the signal ΔVnoise having the noise component output from the DACs 230 and 401 to the analog signal received in step 501 and may input the signal to the first input terminal of the comparator 210.

In step 511, the comparator 210 of the SAR-type ADC may compare the signals of the first input terminal and the second input terminal, and may output a result signal of the comparison to the SAR 220.

In step 513, the SAR 220 of the SAR-type ADC may set (or fix) the value of the corresponding bit based on the output signal of the comparator 210.

In step 515, the SAR 220 of the SAR-type ADC may check whether the value setting for all N bits is completed. When the value setting for all N bits is not completed, the SAR 220 may return to the step 503 in order to set the value of the next lower-order bit. When the value setting for all N bits is completed, for example, when values are set from the most significant bit to the least significant bit, the SAR 220 may output the values for the N bits as digital data in step 517. For example, the SAR 220 may output the values for the N bits as a digital signal for the analog signal received in step 501.

Table 2 below shows performance evaluation results of the conventional SAR-type ADC and the SAR-type ADC proposed in the present disclosure. In Table 2 below, the conventional structure means a conventionally provided 10-bit SAR-type ADC, and the proposed structure may mean a 10-bit SAR-type ADC proposed in the present disclosure shown in FIGS. 11 to 13.

TABLE 2

| Performance | SNR (dB) | SNDR (dB) | THD (−dB) | ENOB (bit) |
|---|---|---|---|---|
| Conventional structure | 54 | 49 | 51 | 7.98 |
| Proposed structure | 60 | 59 | 67 | 9.57 |

Looking at the performance evaluation results in Table 2, it can be seen that the ADC of the structure proposed in the present disclosure from which noise components are removed has far superior characteristics than the ADC of the conventional structure. Here, a signal-to-noise ratio (SNR) means an analog signal-to-noise ratio, and a signal-to-noise distortion ratio (SNDR) means an analog signal-to-noise and harmonic distortion ratio. Also, a total harmonic distortion (THD) means a total harmonic distortion ratio, and an effective number of bits (ENOB) means the effective number of bits excluding noise and harmonic distortion. Here, the SNR may be defined as follows.

$$\text{SNR} = 10\ \log(Ps/P\text{noise}) = 20\ \log(V\text{signal}/V\text{noise})\ [\text{dB}] \quad \text{Equation (3)}$$

In Equation 3, Ps may mean a desired signal power, and Pnoise may mean an undesired signal power, which may mean noise.

A high analog signal-to-noise ratio means that an applied analog signal can be converted into a more detailed digital signal. For example, a nine-bit ADC can subdivide an analog signal into 512 (=2⁹) codes, and a ten-bit ADC can subdivide an analog signal into 1024 (=2¹⁰) codes. In terms of SNR characteristics, this can be as the following equation.

Equation 4 represents the SNR of the nine-bit ADC, and Equation 5 represents the SNR of the ten-bit ADC.

$$\text{SND} = 20\ \log(V\text{signal}/V\text{noise}) = 20\ \log(2^9/1) = 20\ \log(512) = 54\ \text{dB} \quad \text{Equation (4)}$$

$$\text{SNR} = 20\ \log(V\text{signal}/V\text{noise}) = 20\ \log(2^{10}/1) = 20\ \log(1024) = 60\ \text{dB} \quad \text{Equation (5)}$$

As shown in Equations 4 and 5, when the ADC proposed in present disclosure is used instead of the ADC of the conventional structure, it can be seen that the characteristics of the ADC are improved.

In the analog-to-digital converter according to one or more embodiments of the present disclosure, the analog input voltage is boosted and is provided to the gate of the analog switch, so that the voltage between the gate and the drain of the analog switch is greater than the threshold voltage. Accordingly, the ON-resistance is minimized and is kept at a constant value, and thus, the accuracy of the analog switch is improved.

In addition, in the successive approximation register type analog-to-digital converter according to one or more embodiments of the present disclosure, by applying noise components applied to the output value of the internal digital-to-analog converter to the analog signal input terminal of the comparator, even in the presence of various types of noise, the same performance as in a noise-free environment can be obtained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-to-digital converter, comprising:
   a sample and hold circuit configured to sample an analog input voltage and hold the sampled voltage,
   wherein the sample and hold circuit comprises:
      an analog switch configured to generate a boosting voltage obtained by adding a constant voltage to the analog input voltage and output an analog output voltage corresponding to the analog input voltage by using the boosting voltage; and
      a first capacitor in which the analog output voltage is charged, wherein the analog switch comprises:
a bootstrap configured to generate the boosting voltage by adding the constant voltage to the analog input voltage according to a control signal, and output the boosting voltage; and
a switch comprising a first NMOS transistor and configured to be turned on and output the analog output voltage corresponding to the analog input voltage in response to the boosting voltage being input to a gate of the switch, and
wherein the bootstrap comprises:
a second capacitor in which the constant voltage is charged according to a clock signal for sampling; and
a transmission gate configured to transfer the analog input voltage to the second capacitor based on a voltage sampling signal, and
wherein the analog input voltage transferred from the transmission gate is added to the constant voltage charged in the second capacitor and the boosting voltage is output to an output terminal of the bootstrap.

2. The analog-to-digital converter of claim 1, wherein the first NMOS transistor comprises a source receiving the analog input voltage, the gate receiving the boosting voltage, and a drain outputting the analog output voltage.

3. The analog-to-digital converter of claim 1, wherein a gate-source voltage of the first NMOS transistor becomes the constant voltage irrespective of the analog input voltage.

4. The analog-to-digital converter of claim 1, wherein the second capacitor comprises at least one NMOS transistor.

5. The analog-to-digital converter of claim 1, wherein the transmission gate comprises an NMOS transistor and a PMOS transistor connected in parallel,
wherein the voltage sampling signal is input to a gate of the NMOS transistor of the transmission gate, and a voltage sampling inversion signal is input to a gate of the PMOS transistor, and
wherein the voltage sampling inversion signal is obtained by inverting the voltage sampling signal.

6. The analog-to-digital converter of claim 1, wherein the bootstrap further comprises:
first and second resistance elements connected in series between a power supply voltage and a ground, and configured to divide the power supply voltage; and
a second NMOS transistor configured to receive the divided power supply voltage, and
wherein the second NMOS transistor comprises a gate configured to receive the divided power supply voltage, a drain connected to a clock signal input terminal, and a source connected to the second capacitor.

7. The analog-to-digital converter of claim 6, wherein the bootstrap further comprises a third NMOS transistor,
wherein both ends of the third NMOS transistor are connected to the second capacitor and the ground, and
wherein a gate of the third NMOS transistor is configured to receive a voltage holding signal.

8. The analog-to-digital converter of claim 7, wherein the voltage sampling signal and the voltage holding signal are non-overlapping.

9. An analog switch comprising:
a bootstrap configured to generate a boosting voltage obtained by adding a constant voltage to an analog input voltage according to a control signal, and output the boosting voltage; and
a switch comprising a first NMOS transistor and configured to receive the boosting voltage through a gate which is turned on by the boosting voltage, and output an analog output voltage corresponding to the analog input voltage,
wherein the switch is connected to a first capacitor in which the analog output voltage is charged,
wherein the bootstrap comprises:
a second capacitor in which the constant voltage is charged according to a clock signal for sampling; and
a transmission gate configured to transfer the analog input voltage to the second capacitor according to a voltage sampling signal, and
wherein the analog input voltage transferred from the transmission gate is added to the constant voltage charged in the second capacitor, and the boosting voltage is output to an output terminal of the bootstrap.

10. The analog switch of claim 9, wherein a gate-source voltage of the first NMOS transistor becomes the constant voltage irrespective of the analog input voltage.

11. The analog switch of claim 9, wherein the second capacitor comprises at least one NMOS transistor.

12. The analog switch of claim 11, wherein the transmission gate comprises an NMOS transistor and a PMOS transistor connected in parallel,
wherein the voltage sampling signal is input to a gate of the NMOS transistor of the transmission gate, and a voltage sampling inversion signal is input to a gate of the PMOS transistor, and
wherein the voltage sampling inversion signal is obtained by inverting the voltage sampling signal.

13. The analog switch of claim 9, wherein the bootstrap further comprises:
first and second resistance elements connected in series between a power supply voltage and a ground, and configured to divide the power supply voltage; and
a second NMOS transistor configured to receive the divided power supply voltage, and
wherein the second NMOS transistor comprises a gate configured to receive the divided power supply voltage, a drain connected to a clock signal input terminal, and a source connected to the second capacitor.

14. The analog switch of claim 13, wherein the bootstrap further comprises a third NMOS transistor,
wherein both ends of the third NMOS transistor are connected to the second capacitor and the ground,
wherein a gate of the third NMOS transistor is configured to receive a voltage holding signal, and
wherein the voltage sampling signal and the voltage holding signal are non-overlapping.

15. An operation method of an analog-to-digital converter, the operation method comprising:
generating a boosting voltage by adding a constant voltage to an analog input voltage in an analog switch;
outputting an analog output voltage corresponding to the analog input voltage by using the boosting voltage in the analog switch;
charging the analog output voltage in a first capacitor; and
converting the analog output voltage into a digital signal,
wherein the generating of the boosting voltage comprises:
charging the constant voltage in a second capacitor by using a clock signal in the analog switch; and
adding the constant voltage charged in the second capacitor to the analog input voltage and outputting the added result, by using a voltage sampling signal.

* * * * *